(12) United States Patent
Hashimoto

(10) Patent No.: US 7,692,505 B2
(45) Date of Patent: Apr. 6, 2010

(54) CRYSTAL OSCILLATOR

(75) Inventor: Hideo Hashimoto, Sayama (JP)

(73) Assignee: Nihom Dempa Kogyo Co., Ltd., Tokyo (JP)

(\*) Notice: Subject to any disclaimer, the term of this patent is extended or adjusted under 35 U.S.C. 154(b) by 194 days.

(21) Appl. No.: 11/500,433

(22) Filed: Aug. 8, 2006

(65) Prior Publication Data
US 2007/0030083 A1 Feb. 8, 2007

(30) Foreign Application Priority Data
Aug. 8, 2005 (JP) ............................ 2005-229079

(51) Int. Cl.
*H03B 5/32* (2006.01)
(52) U.S. Cl. ............ 331/158; 331/116 R; 331/116 FE; 331/176
(58) Field of Classification Search ............ 331/116 R, 331/116 FE, 158, 176
See application file for complete search history.

(56) References Cited

U.S. PATENT DOCUMENTS

| | | | | |
|---|---|---|---|---|
| 4,600,900 A | * | 7/1986 | Renoult et al. | 331/116 R |
| 6,771,135 B2 | * | 8/2004 | Kubo et al. | 331/66 |
| 6,949,983 B2 | * | 9/2005 | Satoh | 331/158 |
| 7,248,127 B2 | * | 7/2007 | Ishikawa et al. | 331/158 |
| 2005/0285690 A1 | | 12/2005 | Ishikawa et al. | |

FOREIGN PATENT DOCUMENTS

JP 09-153740 A 6/1997

\* cited by examiner

*Primary Examiner*—Arnold Kinkead
(74) *Attorney, Agent, or Firm*—Fitch, Even, Tabin & Flannery

(57) ABSTRACT

A crystal oscillator in which phase noise is reduced includes: a resonance circuit having a crystal unit and split capacitors connected to the crystal unit; a transistor for oscillation having a base connected to the connection node of the crystal unit and the split capacitors; an output line for connecting the node for connecting together the split capacitors and the emitter of the transistor; a crystal resonator inserted in the output line; and a resistor connected in parallel to the crystal resonator.

2 Claims, 3 Drawing Sheets

US 7,692,505 B2

CRYSTAL OSCILLATOR

This Application is a U.S. Nonprovisional Utility Patent Application which claims foreign priority from Japanese Application No. 2005-229079, filed Aug. 8, 2005, the complete disclosure of which is incorporated herein by reference.

BACKGROUND OF THE INVENTION

1. Field of the Invention

The present invention relates to a quartz crystal oscillator in which phase noise is reduced by inserting a crystal resonator in a feedback loop of an amplifier for oscillation, and more particularly to a crystal oscillator that reliably maintains oscillation.

2. Description of the Related Art

Crystal oscillators feature a high degree of stability of oscillation frequency and are therefore frequently used in high-performance radio equipment. In these crystal oscillators, Japanese Patent Laid-open Application No. 9-153740 (JP-A-H9-153740), for example, discloses a crystal oscillator in which a crystal resonator is arranged in the output portion of an oscillation circuit separate from the quartz crystal unit for oscillation. The crystal oscillator having a separate crystal resonator can both increase frequency stability and reduce phase noise.

FIG. 1 shows an example of the configuration of a conventional crystal oscillator that is provided with a crystal unit and a crystal resonator. This crystal oscillator is basically made up from resonance circuit 1 and amplifier 2 for oscillation.

Resonance circuit 1 is composed of crystal unit 3 as an inductive component, and split capacitors 4a and 4b. Capacitors 4a and 4b are connected together in a series, and crystal unit 3 is further connected in parallel to the serially connected pair of capacitors 4a and 4b.

Amplifier 2 is provided with transistor Q for oscillation and feeds back and amplifies an oscillation frequency component that depends on resonance circuit 1. In amplifier 2, the base of transistor Q is connected to the connection node between capacitor 4a and crystal unit 3, and the collector of transistor Q is connected to power supply Vcc by way of collector resistor R4. The collector is also connected to output terminal Vout. The emitter of transistor Q is connected to one end of load resistor R3. The other end of load resistor R3 is connected both to ground and to the connection node between capacitor 4b and crystal unit 3. Output line 5 that makes up one portion of the feedback loop is provided such that the connection node between capacitors 4a and 4b is connected with the emitter of transistor Q. Crystal resonator 6 is inserted in output line 5. Bias resistors R1 and R2 are provided for applying a bias voltage to the base of transistor Q.

Both of crystal unit 3 and crystal resonator 6 are configured from crystal blanks cut at the same cut angle from a quartz crystal block. More specifically, crystal unit 3 and crystal resonator 6 are constituted from, for example, an AT-cut quartz crystal blank. The resonant frequency of crystal resonator 6 is then set to generally match the oscillation frequency of the crystal oscillator. In this crystal oscillator, only the fundamental wave component of oscillation frequency f passes through crystal resonator 6, whereby the output signal is a narrow band and the phase noise in the output signal can be reduced. In other words, crystal resonator 6 is used as a filter for removing the spurious component in the oscillation output and extracting only the fundamental wave component. Further, output terminal Vout may be connected to the emitter of transistor Q.

To attain a further stabilization of the oscillation frequency in this type of crystal oscillator, crystal unit 3 is normally accommodated within a thermostatic oven and caused to operate in an environment in which the temperature is fixed.

Curve A in FIG. 2 shows the relation between temperature and the frequency deviation $\Delta f/f$ where f is the nominal oscillation frequency of the crystal unit, and $\Delta f$ is the difference of the actual oscillation frequency from the nominal oscillation frequency f. Typically, the frequency deviation exhibits change that can be represented by a cubic function curve with respect to temperature. As can be seen from this graph, the crystal unit has a minimum oscillation frequency in the vicinity of 70° C., and the temperature in the thermostatic oven that accommodates crystal unit 3 is normally set to approximately 70° C.

However, because the crystal oscillator of the above-described configuration uses a thermostatic oven, some time period is required for the temperature in the thermostatic oven to reach, for example, 70° C. from the introduction of the power supply, and the problem therefore occurs that the start-up characteristics are poor during this interval due to changes in the oscillation frequency and instability of oscillation.

Crystal resonator 6 also has a frequency-temperature characteristic that exhibits a cubic function curve similar to that of the crystal unit. The crystal resonator is arranged outside the thermostatic oven, and the temperature of the crystal resonator is therefore normal temperature while the temperature of the crystal unit is, for example, 70° C. The crystal resonator is designed such that the resonant frequency of the crystal resonator will match the fundamental wave component of the oscillation frequency that results from the crystal unit, but if the temperature of the crystal unit is close to normal temperature immediately following the introduction of the power supply, the oscillation frequency resulting from crystal unit will vary widely from the resonant frequency of the crystal resonator, thus raising the problem that the fundamental wave component of the oscillation frequency will not pass through the crystal resonator and the circuit will not oscillate.

Accommodating the crystal resonator in a thermostatic oven can also be considered, but adopting such an approach would necessitate a larger thermostatic oven and would both increase power consumption and impede miniaturization of the crystal oscillator.

In response to this problem, the inventors of the present invention proposed a crystal oscillator in US 2005/0285690 A1 in which a temperature compensation mechanism is connected to both the crystal unit and crystal resonator to both eliminate the need for a thermostatic oven and prevent halts in oscillation caused by temperature-changes. As the temperature compensation mechanism used in this case, there is an indirect type in which a voltage-variable capacitance element is connected to each of a crystal unit and crystal resonator to apply a compensation voltage from a compensating voltage generation circuit to the voltage-variable capacitance element, and a direct type in which the temperature compensation circuit is directly connected to each of the crystal unit and crystal resonator.

FIG. 3A shows the configuration of a crystal oscillator that uses the temperature compensation mechanism of the indirect type. This crystal oscillator is of a configuration in which, in the circuit shown in FIG. 1, voltage-variable capacitance element 7a is inserted between crystal unit 3 and ground, and voltage-variable capacitance element 7b is inserted in output line 5 between the node at which split capacitors 4a and 4b are connected together and crystal resonator 6. Resistor R7 is inserted between ground and the connection node between voltage-variable capacitance element 7b and crystal resonator 6. In addition, compensation voltage generation circuit (TCN) 8 is provided for generating a compensating voltage according to the ambient temperature, and the compensating voltage is applied to voltage-variable capacitance elements 7a and 7b by way of high-frequency blocking resistors R5 and R6, respectively. As voltage-variable capacitance elements 7a and 7b, variable capacitance diodes may be used.

In the crystal oscillator shown in FIG. 3A, a compensation voltage is applied to voltage-variable capacitance elements 7a and 7b, whereby the load capacitance as seen from crystal unit 3 and crystal resonator 6 changes depending on the compensating voltage, and the resonant frequency of resonance circuit 1 that contains crystal unit 3 and the resonant frequency of crystal resonator 6 change according to the compensating voltage. By here making the temperature characteristic of the compensating voltage the inverse characteristic, as shown by curve B of FIG. 2, of the frequency-temperature characteristic of the crystal unit and crystal resonator, changes in the resonant frequency caused by the compensating voltage will cancel the changes in the resonant frequency caused by the ambient temperature, and the oscillation frequency of the crystal oscillator is thus kept uniform regardless of the ambient temperature.

FIG. 3B shows the temperature compensation mechanism of the direct type. When the temperature compensation mechanism of the direct type is used, temperature compensation circuit 9 made up from thermistors Rt1 and Rt2 and capacitors C1 and C2 is used, and this temperature compensation circuit 9 is connected in a series to each of crystal unit 3 and crystal resonator 6. In temperature compensation circuit 9, thermistor Rt1 and capacitor C1 are connected in parallel to form a high-temperature compensation circuit, thermistor Rt2 and capacitor C2 are connected in parallel to form a low-temperature compensation circuit, and the high-temperature compensation circuit and low-temperature compensation circuit are then connected in a series. In the case of using this temperature compensation circuit 9 as well, the frequency-temperature characteristics of crystal unit 3 and crystal resonator 6 are compensated, and the oscillation frequency of the crystal oscillator is kept uniform regardless of the ambient temperature.

Nevertheless, even in a crystal oscillator in which a temperature compensation mechanism has been provided to eliminate the need for a thermostatic oven, and moreover, to prevent oscillation halts due to temperature changes, oscillation may still be interrupted due to changes in the power supply voltage and the like. When the power supply voltage to oscillation circuit 1 changes, the oscillation frequency generated by crystal unit 3 changes slightly, but the resonance frequency of crystal resonator 6 remains almost unaffected by the power supply voltage. Thus, when the oscillation frequency generated by crystal unit 3 changes due to fluctuation in the power supply voltage, there arises the possibility that, as in the previously described case, the oscillation signal will not be able to pass through crystal resonator 6 and oscillation will halt. This problem of interruptions in oscillation can occur regardless of the provision or lack of a thermostatic-oven or temperature compensation mechanism.

Even if the resonant frequency of crystal resonator 6 is set to coincide with the oscillation frequency produced by crystal unit 3, the occurrence of a change in only the oscillation frequency produced by crystal unit 3 due to any reason will prevent the oscillation frequency component from passing through crystal resonator 6, raising the problem of interruptions in oscillation. This problem occurs because crystal unit 3 and crystal resonator 6 both have high resonance acutance (i.e., Q value) and the pass frequency range of crystal resonator 6 has a narrow pass bandwidth in, for example, the 3 dB attenuation band.

SUMMARY OF THE INVENTION

It is an object of the present invention to provide a crystal oscillator that is provided with a crystal resonator for reducing phase noise in the oscillation frequency and that prevents the occurrence of interruptions in oscillation caused by the difference between the oscillation frequency of the crystal oscillator and the resonant frequency of the crystal resonator.

The object of the present invention is attained by a crystal oscillator which includes: a resonance circuit having a crystal unit and split capacitors connected to the crystal unit; a transistor for oscillation having a base connected to the connection node of the crystal unit and split capacitors; an output line for connecting the node connecting together the split capacitors and the emitter of the transistor; a crystal resonator inserted in the output line; and a resistor connected in a series to the crystal resonator.

In the present invention, a resistor which is connected in parallel to the crystal resonator reduces the resonance acutance (i.e., Q value) of the crystal resonator, or strictly speaking, reduces the resonance acutance of the parallel circuit of the crystal resonator and resistor, and broadens the pass bandwidth of the crystal resonator. The resistor that is here connected in parallel to the crystal resonator is referred to as a damping resistor.

Taking an extreme case into consideration, when the resistance of the damping resistor is zero, i.e., in the event of a short-circuit over the two ends of the crystal resonator, current no longer flows to the crystal resonator and the parallel circuit of the crystal resonator and damping resistor exhibits no resonance characteristic, and therefore exhibits no filtering action. On the other hand, when the resistance of the damping resistor is infinite ($\infty$), i.e., when the damping resistor is realized as an open circuit, current flows only to the crystal resonator, whereby the Q value of the parallel circuit becomes the Q value of the crystal resonator. Accordingly, the resistance of the damping resistor that is provided in parallel with the crystal resonator allows the Q value of the parallel circuit to be varied from the Q value of the crystal resonator it self down to zero. It should be noted that the Q value can be reduced even if a resistor is serially connected to the crystal resonator, but this approach is not expedient because in such cases, the equivalent resistance of the crystal resonator is substantially larger, whereby the circuit loss increases and the oscillation output level drops.

Reducing the apparent Q value of the crystal resonator, i.e., the Q value of the parallel circuit of the crystal resonator and the damping resistor, enables a broadening of the apparent bandwidth in the resonant frequency of the crystal resonator. If the apparent Q value is reduced by the damping resistor, almost all of the fundamental wave component of this oscillation frequency can pass through the crystal resonator despite slight changes on the ppm (part-per-million) order of the oscillation frequency in the oscillation circuit. As a result, halts in oscillation are prevented and stable oscillation is maintained.

When the value of damping resistor is made extremely low, the Q value of the parallel circuit drops greatly to exhibit a broad bandwidth characteristic that allows components other than the fundamental wave component to pass through crystal resonator and gives rise to phase noise. Accordingly, the value of the damping resistor is selectively set to a value that allows for changes in the oscillation frequency on the ppm order to obtain a Q value (bandwidth) in which the fundamental wave component passes.

In the crystal oscillator of the present invention, a temperature compensation mechanism may be provided for compensating the frequency-temperature characteristic of the crystal unit. Providing a temperature compensation mechanism for the crystal unit prevents changes in the oscillation frequency caused by the frequency-temperature characteristic of the crystal unit and enables the supply of a stable oscillation frequency. In this case, changes in the ambient temperature will, due to the frequency-temperature characteristic of the crystal resonator, also cause changes on the order of several ppm in the resonant frequency of the crystal resonator, whereby the resonant frequency will diverge on the order of several ppm from the oscillation frequency in which temperature compensation is being implemented. In the present invention, a damping resistor is provided to reduce the apparent Q value of a crystal resonator and broaden the bandwidth, whereby the oscillation frequency component can pass the crystal resonator regardless of divergence between oscillation frequency and resonant frequency that accompanies changes in temperature. Accordingly, oscillation is continued at a temperature-compensated oscillation frequency. Compared to the configuration described in US 2005/0285690 A1, the present invention allows a simplification of the circuit configuration because, even when a temperature compensation mechanism is provided in the configuration of the present invention, the temperature compensation mechanism need only be provided for the crystal unit.

DETAILED DESCRIPTION OF THE PREFERRED EMBODIMENTS

Figure 1:
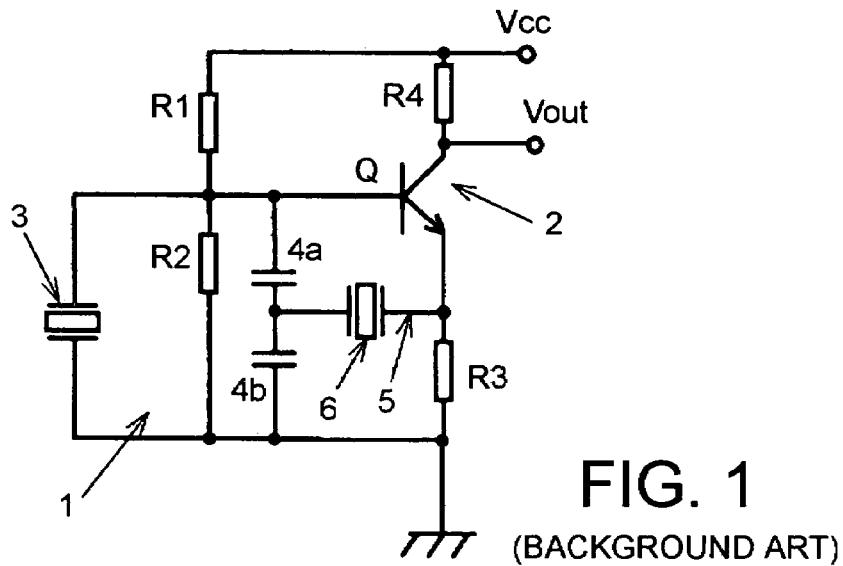
FIG. 1 is a circuit diagram showing an example of the configuration of a conventional crystal oscillator.
Figure 2:
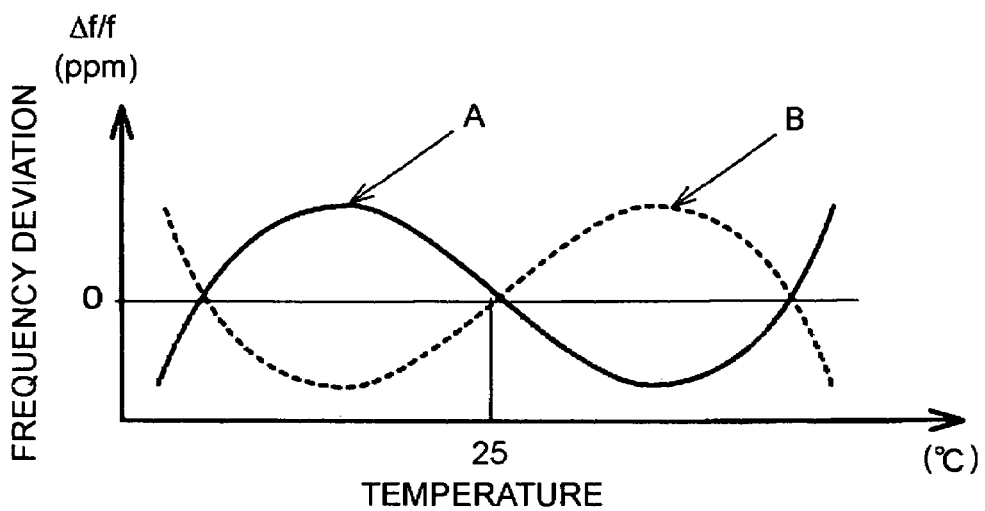
FIG. 2 is a graph for explaining the frequency-temperature characteristic of the crystal resonator and compensating voltages for temperature.
Figure 4:
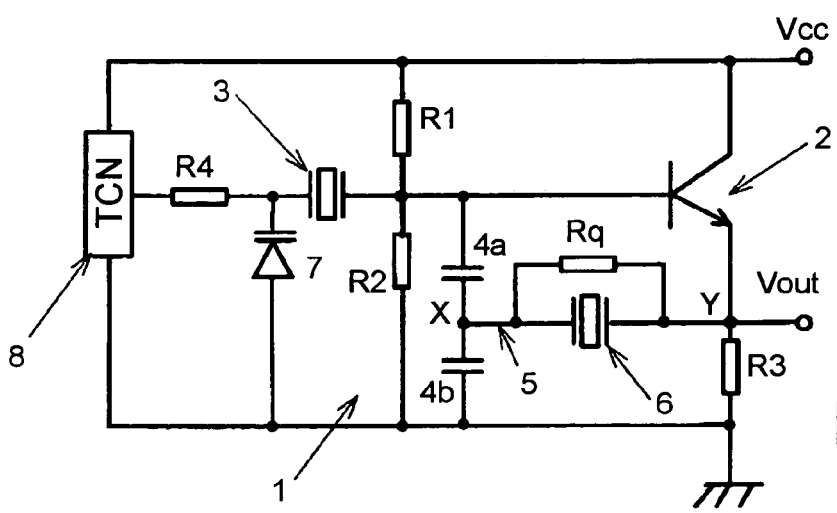
FIG. 4 is a circuit diagram showing the configuration of a crystal oscillator according an embodiment of the present invention.

In FIG. 4, which shows a quartz crystal oscillator according to a preferable embodiment of the present invention, the same reference numerals are given to constituent elements that are identical to elements in FIG. 1, and redundant explanation of these elements is here omitted.

As with the crystal oscillator shown in FIG. 1, the crystal oscillator shown in FIG. 4 is provided with: resonance circuit 1 that is made up from quartz crystal unit 3 and split capacitors 4a and 4b; oscillation transistor Q for feeding back and amplifying the oscillation frequency component; and quartz crystal resonator 6 inserted in output line 5. In the circuit shown in FIG. 4, damping resistor Rq is provided in parallel to crystal resonator 6, and temperature compensation is realized for crystal unit 3 by a temperature compensation mechanism of the indirect type. In the circuit shown in FIG. 4, moreover, the collector of transistor Q is directly connected to power supply Vcc without the provision of a collector resistor. Output terminal Vout is directly connected to the emitter of transistor Q. Devices having AT-cut quartz crystal blanks are used as crystal unit 3 and crystal resonator 6. The oscillation frequency realized by crystal unit 3 and the resonant frequency of crystal resonator 6 are substantially identical if error is ignored.

Figure 3A:
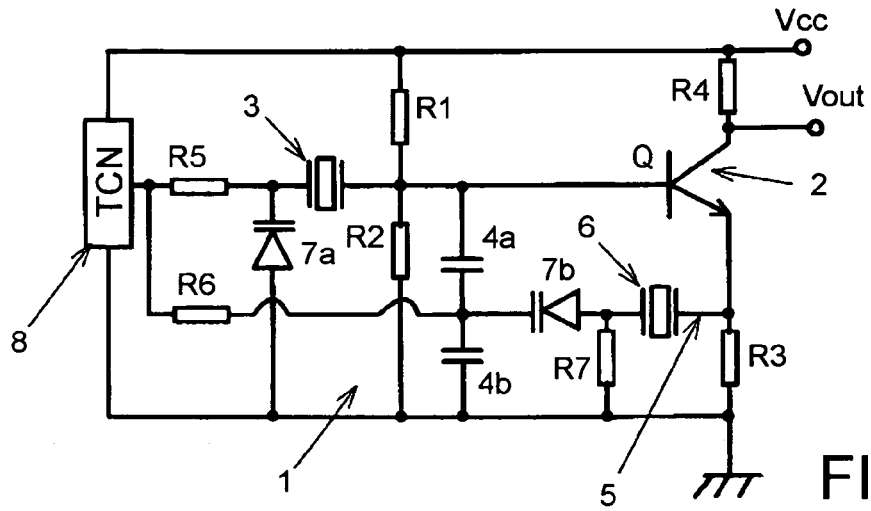
FIG. 3A is a circuit diagram showing an example of the configuration of a conventional crystal oscillator having the indirect type of temperature compensation mechanism.

The temperature compensation mechanism is provided with: voltage-variable capacitance element 7 that is inserted between crystal unit 3 and ground, and compensating voltage generation circuit (TCN) 8 for generating a compensating voltage according to the ambient temperature, and is arranged such that a compensating voltage is applied to voltage-variable capacitance element 7 by way of high-frequency blocking resistor R5. A variable capacitance diode may be used as voltage-variable capacitance element 7. The operating principles of temperature compensation in this crystal oscillator are the same as explained using FIG. 3A.

Figure 5:
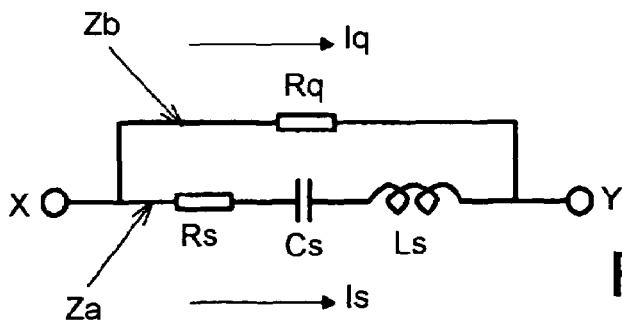
FIG. 5 is an equivalent circuit diagram of a crystal resonator to which a damping resistor is connected in parallel.

In this case, point X is the node for connecting together split capacitors 4a and 4b, and point Y is the node for connecting the emitter of transistor Q and resistor R3. In the circuit shown in FIG. 4, since damping resistor Rq is connected in parallel to crystal resonator 6, the equivalent circuit of the parallel circuit composed of crystal resonator 6 and damping resistor Rq is as shown in FIG. 5. In other words, if Rs is the equivalent serial resistance of crystal resonator 6, Cs is the equivalent serial capacitance, and Ls is the equivalent serial inductance, the auxiliary arm Zb realized by damping resistor Rq is connected in parallel to the serial arm Za composed of resistance Rs, capacitance Cs, and inductance Ls. For the sake of convenience, the equivalent parallel capacitance C0 of crystal resonator 6 is omitted. In this case, current is shunted to serial arm Za and auxiliary arm Zb basically by the resistance ratio of equivalent serial resistance Rs and damping resistor Rq during serial resonance realized by the capacitance Cs and inductor Ls of equivalent serial arm Za. At this time, Is is the current of serial arm Za, and Iq is the current of auxiliary arm Zb.

Figure 6:
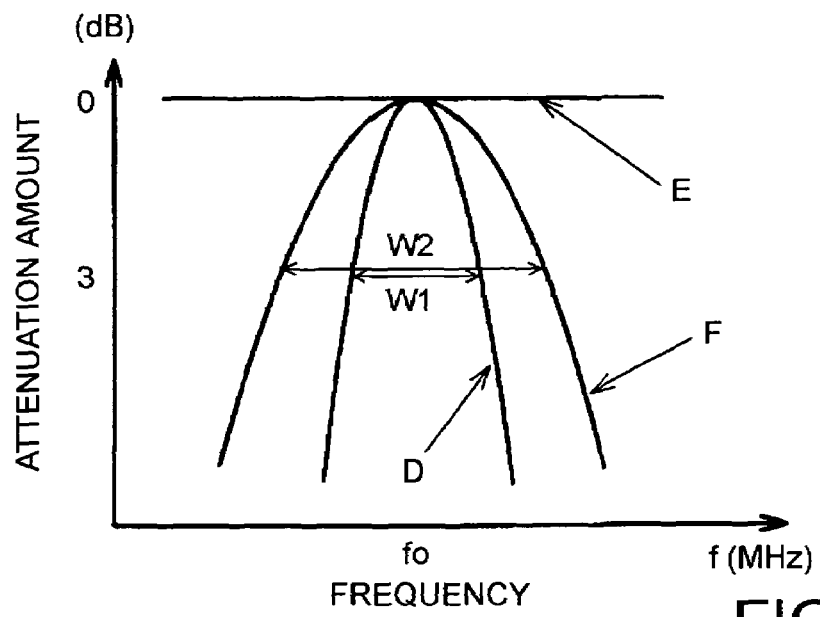
FIG. 6 is a graph showing the frequency characteristic (i.e., resonance characteristic) of a crystal resonator.

As is well known in the art, the frequency characteristic in serial arm Za that results from shunt current Is is the resonance characteristic of the high Q value, i.e., a single peak, as shown by curve D of FIG. 6, due to equivalent serial capacitance Cs and equivalent serial inductance Ls. On the other hand, because only damping resistor Rq is provided, the frequency characteristic on the auxiliary arm Zb that results from shunt current Iq is level as shown by curve E of FIG. 6. Accordingly, the frequency characteristic of the parallel circuit that is the combined current (Is+Iq) from both arms is a broadband characteristic in which curve D and curve E have been combined as shown by curve F of FIG. 6. In other words, the level frequency characteristic of auxiliary arm Zb reduces the Q value of the resonance characteristic of serial arm Za to produce a broadened pass bandwidth. In FIG. 6, all of curves D to F show the levels just at the resonant frequency are 0 dB.

The Q value of the parallel circuit of crystal resonator 6 and damping resistor Rq is determined by the resistance ratio of equivalent serial resistance Rs of serial arm Za and damping resistor Rq of auxiliary arm Zb, whereby the degree of the broader bandwidth of the combined current is determined. For example, the more damping resistor Rq exceeds equivalent serial resistance Rs, the more the state approaches an open state, i.e., a state in which the value of damping resistor Rq approaches infinity, whereby the effect of serial arm Za upon the resonance characteristic is reduced. In contrast, the more damping resistor Rq falls below equivalent serial resistance Rs, the more the state approaches a short-circuit, whereby the Q value decreases and the frequency characteristic becomes broadband and approaches level.

In one example, the oscillation frequency realized by crystal unit 3 is 50 MHz, the resonant frequency of crystal resonator 6 is also 50 MHz, the equivalent serial resistance Rs of crystal resonator 6 is approximately 20Ω, and the pass bandwidth W1 in the 3 dB attenuation band of serial arm Za, i.e., crystal resonator 6 itself, when a damping resistor is not provided is 2 kHz. When damping resistor Rq of 75Ω is here connected, the pass bandwidth W2 in the 3 dB attenuation band of parallel circuit following connection of damping resistor Rq is 10 kHz.

Thus, the parallel circuit of crystal resonator 6 and damping resistor Rq has a very high Q value compared to a normal LC filter, and moreover, has a broader pass bandwidth than the crystal resonator itself.

In the crystal oscillator shown in FIG. 4, since a temperature compensation mechanism is provided in crystal unit 3, the oscillation frequency is therefore maintained with stability despite changes in temperature. In addition, due to the provision of damping resistor Rq in parallel to crystal resonator 6, the parallel circuit of crystal resonator 6 and damping resistor Rq, while having a Q value considerably higher than an LC filter, has a broader pass bandwidth than crystal resonator 6 itself, and as a result, the oscillation frequency component can still pass through crystal resonator 6 even in the event of a frequency difference between the resonant frequency of crystal resonator 6 and the temperature-compensated oscillation frequency which is brought about by fluctuation in the power supply voltage or changes in the ambient temperature. Accordingly, oscillation can be kept stable and phase noise can be suppressed in this crystal oscillator.

Although temperature compensation is implemented for crystal unit 3 in the crystal oscillator as described in the foregoing description, the present invention can be applied even when temperature compensation is not carried out for crystal unit 3. When temperature compensation is not implemented, crystal unit 3 is preferably accommodated in a thermostatic oven to stabilize the oscillation frequency.

Figure 3B:
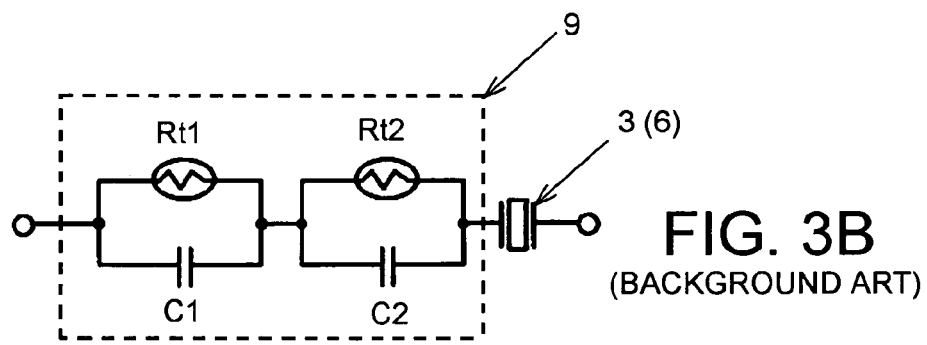
FIG. 3B is a circuit diagram showing the direct type of temperature compensation mechanism.
Figure 7:
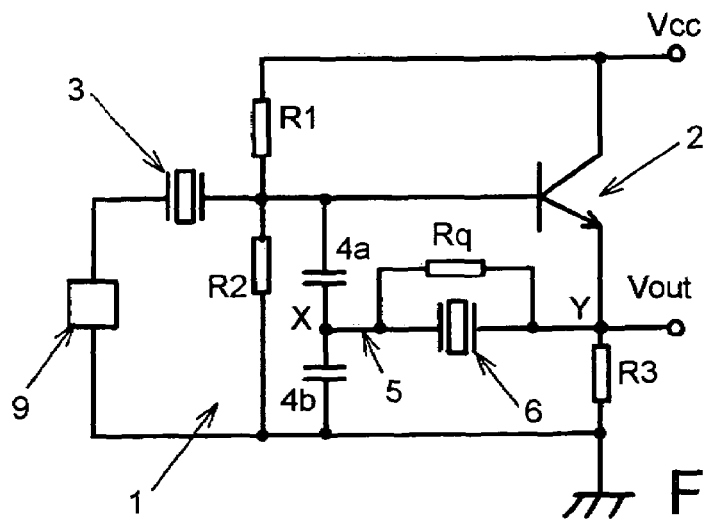
FIG. 7 is a circuit diagram showing the configuration of a crystal oscillator according another embodiment of the present invention.

In addition, as a temperature compensation mechanism for crystal unit 3, the temperature compensation mechanism of the direct type shown in FIG. 3B can be used in addition to the above-described indirect type. FIG. 7 shows a crystal oscillator according to another embodiment of the present invention in which the temperature compensation mechanism of the direct type is employed. In the crystal oscillator shown in FIG. 7, temperature compensation mechanism 9 of the direct type is inserted between crystal unit 3 and ground.

What is claimed is:

1. A crystal oscillator comprising:
    a resonance circuit having a crystal unit and a split capacitor assembly, one end of said split capacitor assembly being connected to said crystal unit, the other end of said capacitor assembly being connected to a ground point, and said split capacitor assembly comprising a first capacitor and a second capacitor serially connected to each other;
    a transistor for oscillation having a base connected to a connection node between said crystal unit and said split capacitor assembly;
    a crystal resonator, one end of said crystal resonator being connected to a connection node between the first capacitor and the second capacitor, and the other end of said crystal resonator being connected to an emitter of said transistor;
    a resistor in parallel connected with said crystal resonator;
    an emitter resistor, one end of said emitter resistor being connected to said emitter, and the other end of said emitter resistor being connected to said ground point; and
    a temperature compensation mechanism for compensating the frequency-temperature characteristic of said crystal unit,
    wherein said temperature compensation mechanism includes a voltage-variable capacitance element connected to said crystal unit and a compensating voltage generation circuit for generating a compensating voltage according to ambient temperature, and
    said compensating voltage is applied to the voltage-variable capacitance element.

2. The crystal oscillator according to claim 1, wherein said voltage-variable capacitance elements is a variable capacitance diode.

* * * * *

UNITED STATES PATENT AND TRADEMARK OFFICE
CERTIFICATE OF CORRECTION

PATENT NO. : 7,692,505 B2
APPLICATION NO. : 11/500433
DATED : April 6, 2010
INVENTOR(S) : Hideo Hashimoto It is certified that error appears in the above-identified patent and that said Letters Patent is hereby corrected as shown below:

On the title page, Item (73)
    Assignee: please change assignee from "Nihom" to --Nihon--.

Signed and Sealed this

Thirtieth Day of November, 2010

David J. Kappos
*Director of the United States Patent and Trademark Office*